(12) United States Patent
Park et al.

(10) Patent No.: US 10,804,303 B2
(45) Date of Patent: Oct. 13, 2020

(54) IMAGE SENSORS COMPRISING AN ORGANIC PHOTO-DETECTOR, A PHOTO-DETECTOR ARRAY AND DUAL FLOATING DIFFUSION NODES AND ELECTRONIC DEVICES INCLUDING THE SAME

(71) Applicant: Samsung Electronics Co., Ltd., Suwon-si, Gyeonggi-do (KR)

(72) Inventors: Kyung Bae Park, Hwaseong-si (KR); Yong Wan Jin, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 81 days.

(21) Appl. No.: 16/233,438

(22) Filed: Dec. 27, 2018

(65) Prior Publication Data

US 2019/0378867 A1 Dec. 12, 2019

(30) Foreign Application Priority Data

Jun. 8, 2018 (KR) .................. 10-2018-0066031

(51) Int. Cl.
   *H01L 27/146* (2006.01)
   *G02B 5/20* (2006.01)
   *H04N 5/225* (2006.01)

(52) U.S. Cl.
   CPC ........ *H01L 27/14621* (2013.01); *G02B 5/201* (2013.01); *H01L 27/1464* (2013.01);
   (Continued)

(58) Field of Classification Search
   CPC ......... H01L 27/14638; H01L 27/14689; H01L 21/76831; H01L 27/14621; H01L 23/5226;
   (Continued)

(56) References Cited

U.S. PATENT DOCUMENTS 7,551,059 B2   6/2009  Farrier
8,183,603 B2   5/2012  Yamaguchi et al.
(Continued)

FOREIGN PATENT DOCUMENTS

JP   2005-332880 A   12/2005
JP      4966618 B2    7/2012
(Continued)

OTHER PUBLICATIONS

Extended European Search Report dated Dec. 3, 2019 for corresponding European Application No. 19167320.1.
(Continued)

*Primary Examiner* — Que Tan Le
(74) *Attorney, Agent, or Firm* — Harness, Dickey & Pierce, P.L.C.

(57) ABSTRACT

An image sensor may include an organic photo-detector configured to selectively detect a near infrared wavelength spectrum of light and photoelectrically convert the detected near infrared wavelength spectrum of light, and a photo-detector array on the organic photo-detector, the photo-detector array including a photo-detector configured to detect a limited wavelength spectrum of visible light and photoelectrically convert the limited wavelength spectrum of visible light. The image sensor may discharge charges photoelectrically converted by the photo-detector to a first floating diffusion node, and the image sensor may discharge charges photoelectrically converted by the organic photo-detector to a second floating diffusion node. An area of the first floating diffusion node may be greater than an area of the second floating diffusion node.

22 Claims, 9 Drawing Sheets

(52) U.S. Cl.
CPC .. *H01L 27/14627* (2013.01); *H01L 27/14645* (2013.01); *H01L 27/14649* (2013.01); *H01L 27/14685* (2013.01); *H04N 5/2254* (2013.01)

(58) Field of Classification Search
CPC ........ H01L 27/14647; H01L 27/14649; G02B 5/20; G02B 5/201; H04N 5/33; H04N 5/2254
USPC .................................. 250/208.1, 214 R, 239
See application file for complete search history.

(56) References Cited

U.S. PATENT DOCUMENTS

| | | | |
|---|---|---|---|
| 8,848,047 | B2 | 9/2014 | Inuiya et al. |
| 8,891,031 | B2 | 11/2014 | Kim et al. |
| 9,329,423 | B2 | 5/2016 | Kim et al. |
| 10,529,755 | B2 * | 1/2020 | Lee .................... H01L 27/1461 |
| 2014/0375826 | A1 | 12/2014 | Lee et al. |
| 2015/0287766 | A1 | 10/2015 | Kim et al. |
| 2016/0099280 | A1 | 4/2016 | Huang et al. |
| 2017/0054924 | A1 | 2/2017 | Chuang et al. |
| 2017/0170239 | A1 | 6/2017 | Lee et al. |
| 2017/0287981 | A1 | 10/2017 | Han et al. |
| 2019/0189696 | A1 | 6/2019 | Yamaguchi et al. |

FOREIGN PATENT DOCUMENTS

| | | |
|---|---|---|
| JP | 5075512 B2 | 11/2012 |
| JP | 2017-112169 A | 6/2017 |
| JP | 2017-208496 A | 11/2017 |
| KR | 10-2013-0014222 A | 2/2013 |
| KR | 1603666 B1 | 3/2016 |
| KR | 10-2017-0112951 S | 10/2017 |
| WO | WO-2017-104486 A1 | 6/2017 |

OTHER PUBLICATIONS

Korean Office Action dated Aug. 9, 2019 for corresponding Korean Application No. 10-2018-0066031.
Korean Notice of Allowance dated Apr. 7, 2020 for corresponding Korean Application No. 10-2018-0066031.

* cited by examiner

IMAGE SENSORS COMPRISING AN ORGANIC PHOTO-DETECTOR, A PHOTO-DETECTOR ARRAY AND DUAL FLOATING DIFFUSION NODES AND ELECTRONIC DEVICES INCLUDING THE SAME

CROSS-REFERENCE TO RELATED APPLICATION

This application claims priority to and the benefit of, under 35 U.S.C. § 119, Korean Patent Application No. 10-2018-0066031 filed in the Korean Intellectual Property Office on Jun. 8, 2018, the entire contents of which are incorporated herein by reference.

BACKGROUND

(a) Field

The present inventive concepts relates to image sensors and electronic devices including the same.

(b) Description of the Related Art

In general, an image pickup device for photographing an image and storing the same as an electrical signal may be included in a digital camera and/or a camcorder, and the image pickup device may include an image sensor for analyzing incident light by wavelengths and converting respective components of the analyzed incident light into electrical signals.

Regarding the image sensor, down-sizing and high resolution are required as the time passes by, and recently, demands on the improvement of image sensitivity and luminance in a low illumination condition such as an interior environment or a nighttime, and particularly, additional functions that are generated by realizing an infrared sensing image sensor such as an iris sensor or a fingerprint sensor are gradually increased.

The above information disclosed in this Background section is only for enhancement of understanding of the background of the inventive concepts and therefore it may contain information that does not form the prior art that is already known in this country to a person of ordinary skill in the art.

SUMMARY

The present inventive concepts may provide an image sensor configured to prevent a degradation of elements under a condition of a manufacturing temperature of a color filter and an ultraviolet (UV) exposure condition.

The present inventive concepts may provide an image sensor configured to reduce crosstalk and prevent a haze phenomenon caused by absorbing near infrared ray (NIR).

The present inventive concepts may provide an image sensor configured to reduce power consumption and blocking surrounded noise.

Technical objects of the present inventive concepts are not limited by the above described technical objects, and the technical objects that are described will be clearly comprehended by a person of ordinary skill in the art.

According to some example embodiments, an image sensor may include a color filter array configured to selectively transmit a limited wavelength spectrum of visible light. The image sensor may include an organic photo-detector above the color filter array. The organic photo-detector may be configured to selectively detect a near infrared wavelength spectrum of light and photoelectrically convert the detected near infrared wavelength spectrum of light. The image sensor may include a photo-detector array beneath the color filter array. The photo-detector array may include a photo-detector configured to detect the selectively transmitted limited wavelength spectrum of visible light and photoelectrically convert the limited wavelength spectrum of visible light. The image sensor may include a through-silicon-via extending through the organic photo-detector. The through-silicon-via may be configured to discharge charges that are photoelectrically converted by the organic photo-detector to a first floating diffusion node through the through-silicon-via. The image sensor may be configured to transmit charges photoelectrically converted by the photo-detector to a second floating diffusion node. An area of the first floating diffusion node may be greater than an area of the second floating diffusion node.

The photo-detector array may have a back side illumination (BSI) structure. A thickness of the photo-detector array may be at least 2.5 μm, such that the photo-detector array is configured to not absorb the near infrared wavelength spectrum of light.

The near infrared wavelength spectrum of light may have a wavelength that is equal to or greater than 800 nm.

The through-silicon-via may include metal and doped polysilicon (doped poly si).

The color filter array may include a first color filter, a second color filter, and a third color filter. The photo-detector array may include a first photo-detector, a second photo-detector, and a third photo-detector. The first color filter may correspond to the first photo-detector, the second color filter may correspond to the second photo-detector, and the third color filter may correspond to the third photo-detector.

The first color filter may be configured to selectively transmit red visible light, the second color filter may be configured to selectively transmit green visible light, and the third color filter may be configured to selectively transmit blue visible light.

The image sensor may further include a plurality of condensing lenses on the organic photo-detector. Each condensing lens of the plurality of condensing lenses may correspond to a separate, respective color filter of the first color filter, the second color filter, and the third color filter.

The area of the first floating diffusion node may be greater than the area of the second floating diffusion node by twice to five times.

The area of the first floating diffusion node may be greater than the area of the second floating diffusion node by five times to ten times.

An electronic device may include the image sensor.

According to some example embodiments, an image sensor may include an organic photo-detector. The organic photo-detector may be configured to selectively detect a near infrared wavelength spectrum of light and photoelectrically convert the detected near infrared wavelength spectrum of light. The image sensor may include a photo-detector array on the organic photo-detector. The photo-detector array may include a photo-detector configured to detect a limited wavelength spectrum of visible light and photoelectrically convert the limited wavelength spectrum of visible light. The image sensor may be configured to discharge charges photoelectrically converted by the photo-detector to a first floating diffusion node. The image sensor may be further configured to discharge charges photoelectrically converted by the organic photo-detector to a second floating diffusion node. An area of the first floating diffusion node may be greater than an area of the second floating diffusion node.

The photo-detector array may have a back side illumination (BSI) structure. A thickness of the photo-detector array may be at least 2.5 μm, such that the photo-detector array is configured to not absorb the near infrared wavelength spectrum of light.

The near infrared wavelength spectrum of light may have a wavelength that is equal to or greater than 800 nm.

The image sensor may further include a color filter array configured to selectively transmit the limited wavelength spectrum of visible light, such that the photo-detector is configured to detect the selectively transmitted limited wavelength spectrum of visible light.

The color filter array may be between the organic photo-detector and the photo-detector array.

The organic photo-detector may be between the color filter array and the photo-detector array.

The color filter array may include a first color filter, a second color filter, and a third color filter. The photo-detector array may include a first photo-detector, a second photo-detector, and a third photo-detector. The first color filter may correspond to the first photo-detector, the second color filter may correspond to the second photo-detector, and the third color filter may correspond to the third photo-detector.

The first color filter may be configured to selectively transmit red visible light, the second color filter may be configured to selectively transmit green visible light, and the third color filter may be configured to selectively transmit blue visible light.

The image sensor may include a plurality of condensing lenses on the organic photo-detector. Each condensing lens of the plurality of condensing lenses may correspond to a separate, respective color filter of the first color filter, the second color filter, and the third color filter.

The area of the first floating diffusion node may be greater than the area of the second floating diffusion node by twice to five times.

The area of the first floating diffusion node may be greater than the area of the second floating diffusion node by five times to ten times.

An electronic device may include the image sensor.

DETAILED DESCRIPTION OF THE EMBODIMENTS

The present inventive concepts will be described more fully hereinafter with reference to the accompanying drawings, in which some example embodiments of the inventive concepts are shown. As those skilled in the art would realize, the described embodiments may be modified in various different ways, all without departing from the spirit or scope of the present inventive concepts.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Terms including ordinal numbers such as first, second, and the like, will be used only to describe various components, and are not interpreted as limiting these components. The terms are only used to differentiate one component from other components.

An image sensor according to some example embodiments will now be described with reference to FIG. 1 to FIG. 4.

Figure 1:
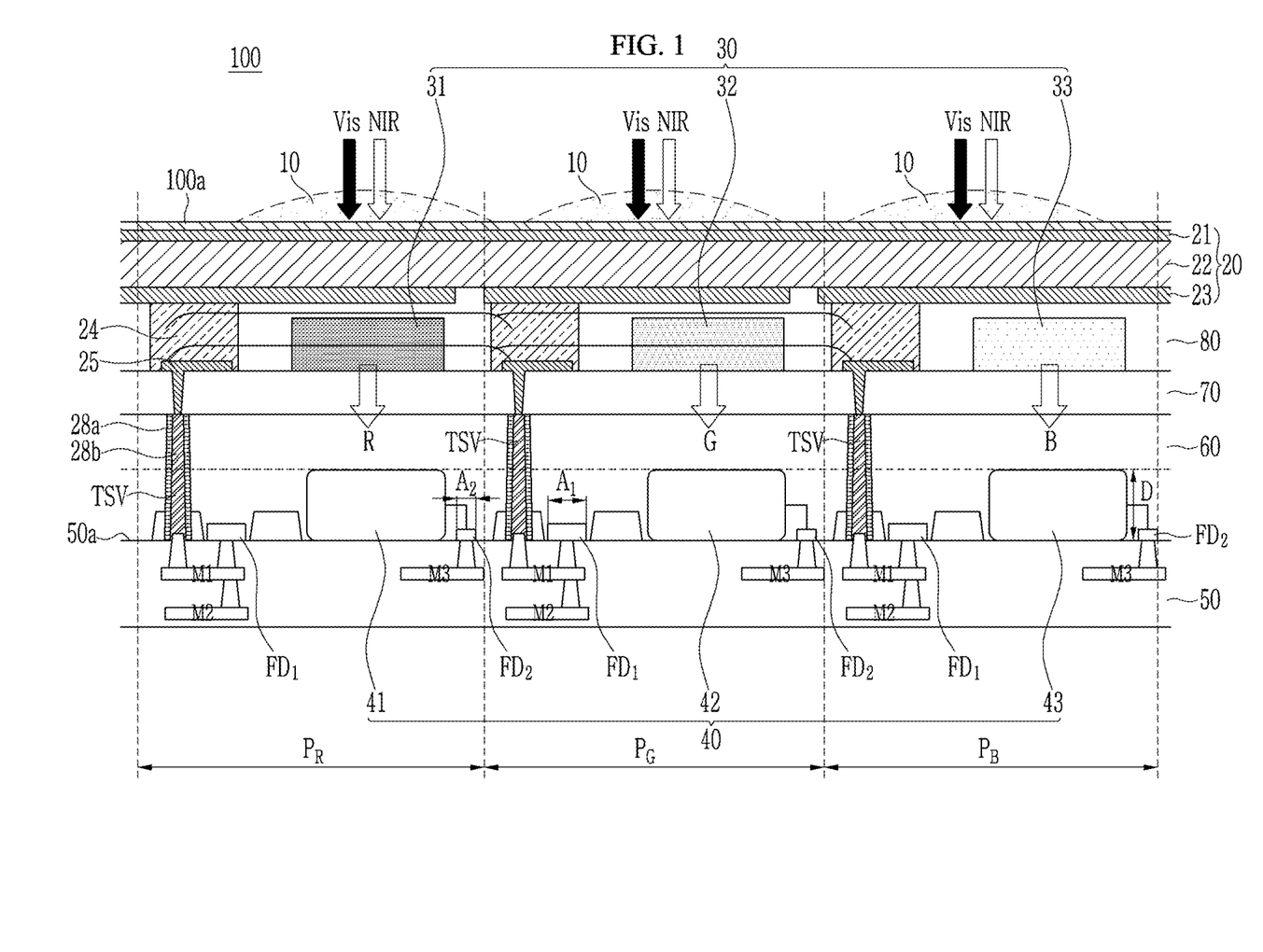
FIG. 1 shows a cross-sectional view of an image sensor according to some example embodiments.

FIG. 1 shows a cross-sectional view of an image sensor according to some example embodiments. As shown in FIG. 1, the image sensor may include multiple pixels $P_R$, $P_G$, $P_B$, but example embodiments are not limited thereto. For example, the image sensor 100 may include a single, individual pixel.

In some example embodiments, the image sensor 100 includes a plurality of condensing lenses 10, an organic photo-detector 20, a color filter array 30, a photo-detector array 40, and a signal unit 50. The signal unit 50 may be referred to herein as a signal layer. As shown in FIG. 1, the organic photo-detector 20 may be on (e.g., above or beneath) the color filter array 30, and the photo-detector array may be on (e.g., beneath or above) the color filter array 30. As described herein, an element that is "on" another element may be above or beneath the other element.

In some example embodiments, a plurality of condensing lenses 10 (e.g., micro lenses) are formed on the organic photo-detector 20. Visible rays (Vis) and near infrared rays (NIR) may be input to a plurality of condensing lenses 10, and the condensing lenses 10 may control a direction of the incident rays to gather them at one point. Each condensing lens 10 may have a cylindrical shape or a hemispherical shape, but is not limited thereto. As shown in FIG. 1, the condensing lenses 10 may be in separate pixels $P_R$, $P_G$, $P_B$ of the image sensor 100. As further shown in FIG. 1, each separate condensing lens of a plurality of condensing lenses 10 of the image sensor 100 may overlap a separate color filter 31, 32, 33 of the color filter array 30 in a direction that is perpendicular or substantially perpendicular (e.g., perpendicular within manufacturing tolerances and/or material tolerances) to an upper surface 50a of the signal unit 50. Accordingly, in some example embodiments, each condensing lens of a plurality of condensing lenses 10 on the organic photo-detector 20 may correspond to a separate, respective color filter of a first color filter 31, a second color filter 32, and a third color filter 33 of the color filter array 30.

Figure 2:
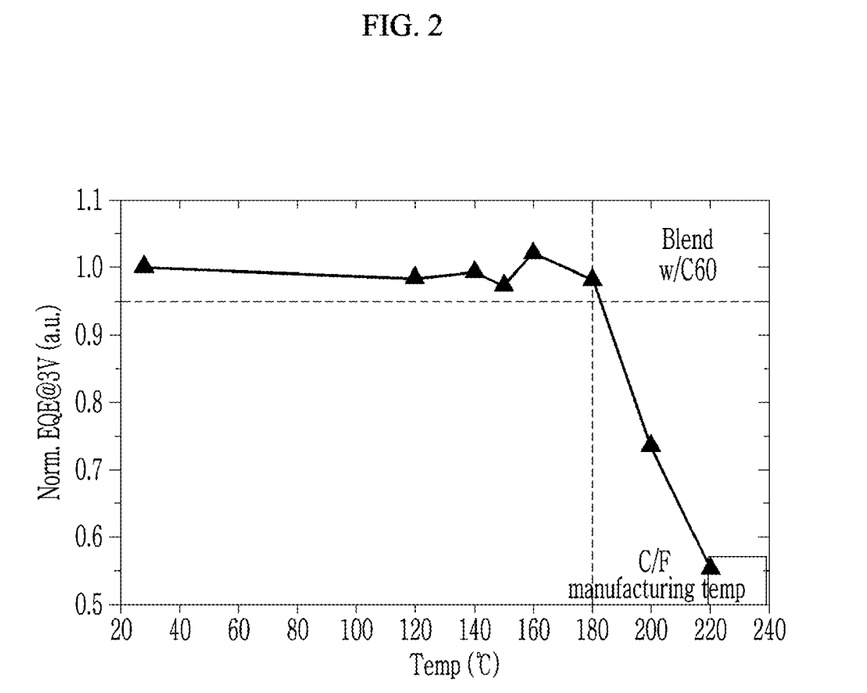
FIG. 2 shows a graph on a manufacturing temperature of a color filter and a degradation temperature of an organic photo-detector according to some example embodiments.

In some example embodiments, the organic photo-detector (OPD) 20 is on (e.g., above) the color filter array 30. Referring to FIG. 2, the element degrading phenomenon may be prevented at the manufacturing temperature of the color filter array 30 and under the UV-exposure condition, so the characteristic of the organic photo-detector 20 may be maintained. In detail, the organic photo-detector 20 may have many aromatic rings and has a metal complex structure, so the organic photo-detector 20 may be degraded at the manufacturing temperature (equal to or greater than 220° C.) of the color filter array 30 and under the strong UV exposure condition. However, the organic photo-detector 20 according to some example embodiments may be formed on the color filter array 30, so the characteristic of the organic photo-detector 20 is maintained irrespective of the manufacturing temperature of the color filter array 30 and the UV exposure condition.

In some example embodiments, the organic photo-detector 20 includes an organic photoelectric conversion layer 22 configured to selectively absorb near infrared rays (NIR) (also referred to herein as a near infrared wavelength spectrum of light) and detect the same, and a first electrode 21 and a second electrode 23 may be on respective sides of the organic photoelectric conversion layer 22. As shown in FIG. 1, the organic photo-detector 20 may include multiple second electrodes 23 on a side of the organic photoelectric conversion layer 22, where each separate second electrode 23 is in a separate pixel of the pixels $P_R$, $P_G$, $P_B$ of the image sensor 100.

In some example embodiments, one of the first electrode 21 and the second electrode 23 is an anode and the other thereof is a cathode. The first electrode 21 and the second electrode 23 may be transparent electrodes, and the transparent electrodes may be made of ("may at least partially comprise") transparent conductors such as an indium tin oxide (ITO) or an indium zinc oxide (IZO), or they may be a single-layered or multi-layered metallic thin film formed to be thin by a thickness of several nanometers to several tens of nanometers, on which a metal thin film or a metal oxide formed to be several nanometers to several tens of nanometers thick is doped.

In some example embodiments, the organic photoelectric conversion layer 22 may perform a photoelectric conversion for selectively absorbing the near infrared ray and converting the near infrared ray into electrons, and the amount of electrons generated at this time may be proportional to the intensity of the near infrared ray. In detail, for example, the organic photoelectric conversion layer 22 may selectively absorb the near infrared ray that is equal to or greater than 800 nm to form excitons, may divide the generated excitons into holes and electrons, may move the divided holes to the anode side that is one of the first electrode 21 and the second electrode 23, and may move the divided electrons to the cathode side that is the other of the first electrode 21 and the second electrode 23, thereby performing a photoelectric conversion. Accordingly, the organic photo-detector 20 may be configured to selectively detect a near infrared wavelength spectrum of light and photoelectrically convert the detected near infrared wavelength spectrum of light.

Figure 4A:
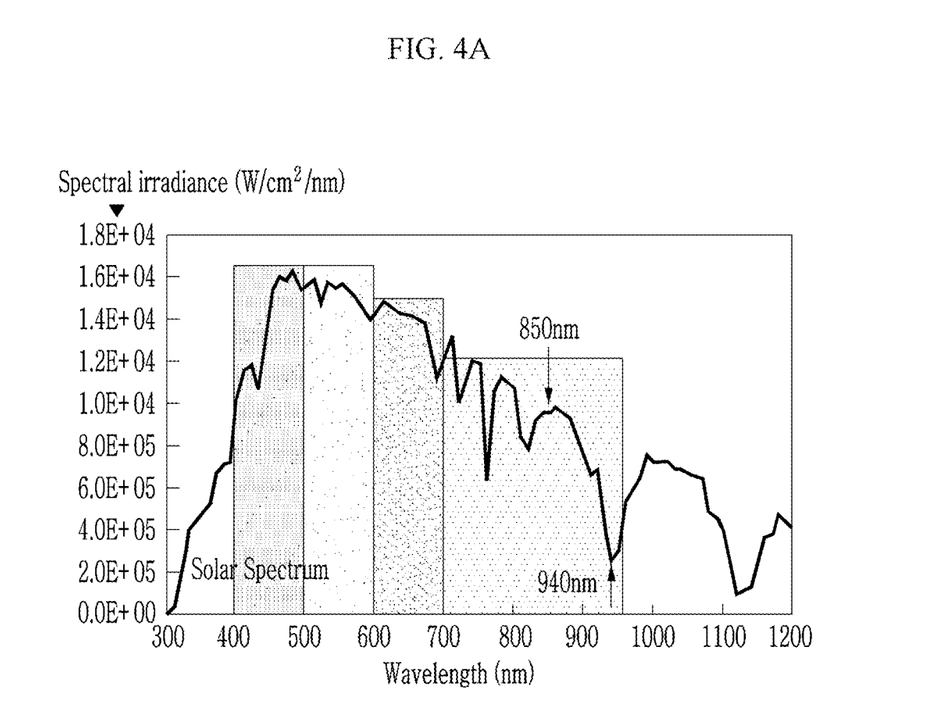
FIG. 4A shows a wavelength of sun light.
Figure 4B:
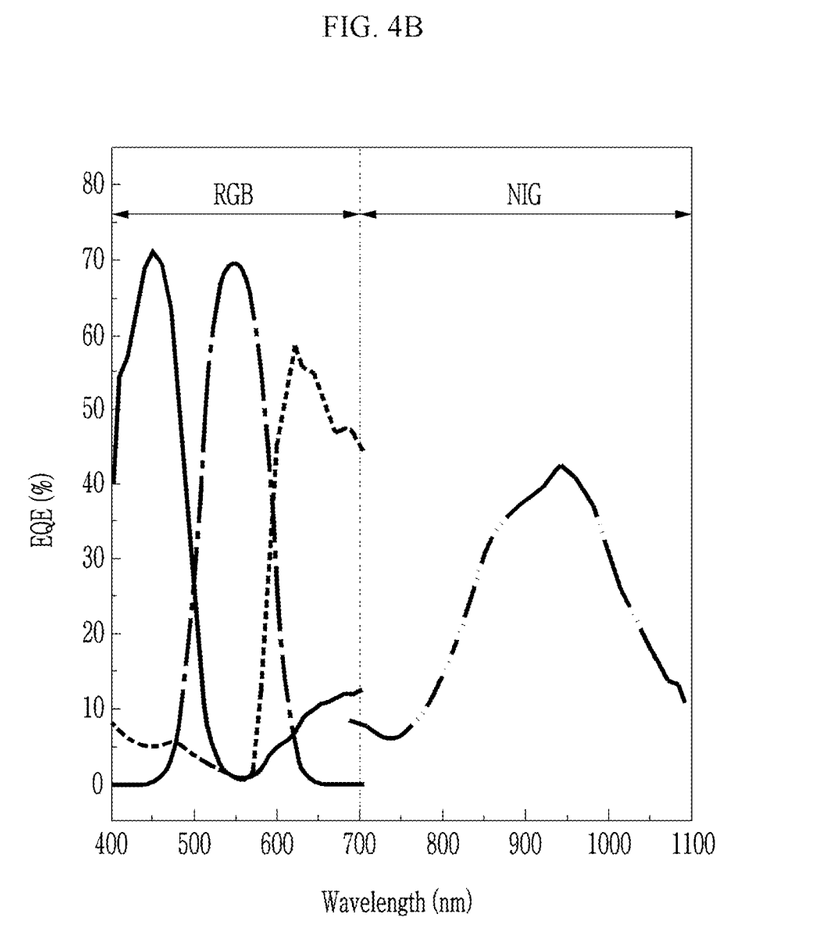
FIG. 4B shows a graph of a light absorbing area of a photo-detector and an organic photo-detector according to some example embodiments.

Further, referring to FIGS. 4A and 4B, light in the 940 nm wavelength range from among the sun light may be the least reflected. Therefore, when the organic photoelectric conversion layer 22 is configured to block light in other wavelength ranges and absorb the most the near infrared ray (NIR) in the 940 nm wavelength range, there is no need to supply a sufficient light source in the 940 nm wavelength range when performing a photoelectric conversion, thereby substantially reducing power consumption and intercepting surrounded noise, thereby improving performance of the image sensor 100.

Therefore, according to some example embodiments, the organic photoelectric conversion layer 22 is formed by using the organic material with the near infrared ray (NIR) absorbing range with is equal to or greater than 800 nm, thereby reducing power consumption and intercepting surrounded noise. Restated, in some example embodiments, the organic photo-detector 20 may be configured to selectively detect a near infrared wavelength spectrum of light and photoelectrically convert the detected near infrared wavelength spectrum of light, where the near infrared wavelength spectrum of light has a wavelength that is equal to or greater than 800 nm.

In some example embodiments, charges photoelectrically converted by the organic photoelectric conversion layer 22 are gathered in the floating diffusion node (FD1, Full-Well). In some example embodiments, the number of charges gathered in the floating diffusion node $FD_1$ is proportional to the intensity of the near infrared ray (NIR).

The organic photoelectric conversion layer 22 may transmit light excluding the near infrared ray (e.g., visible light). Therefore, light having passed through the organic photoelectric conversion layer 22 may not include the near infrared ray, so the organic photoelectric conversion layer 22 may function as a near infrared ray blocking filter.

The organic photoelectric conversion layer 22 may be formed on a whole surface of the image sensor 100. Accordingly, the near infrared ray may be selectively absorbed and the light area is increased on the whole surface of the image sensor, so high light absorbing efficiency may be obtained.

The organic photoelectric conversion layer 22 may include a p-type semiconductor and an n-type semiconductor, and the p-type semiconductor and the n-type semiconductor may form a pn junction. At least one of the p-type semiconductor and the n-type semiconductor may selectively absorb the near infrared ray. The p-type semiconductor and the n-type semiconductor may independently include an organic material, and an inorganic material or an organic material. At least one of the p-type semiconductor and the n-type semiconductor may include an organic material.

Each pixel may include a separate through-silicon-via (TSV) configured to discharge the charges photoelectrically converted by the organic photoelectric conversion layer 22 and then gathered to the floating diffusion node $FD_1$ of the pixel. The through-silicon-via (TSV) for a given pixel may be connected to the separate second electrode 23 patterned for the pixel via respective conductive elements 24 and 25 extending between the second electrode 23 and the through-silicon-via (TSV) via the insulating layers 80 and 70, respectively, may extend through the photo-detector array 40, and may be connected to the floating diffusion node $FD_1$ for the pixel. The charges generated in the organic photoelectric conversion layer 22 may be gathered in the floating diffusion node $FD_1$ of a pixel through the through-silicon-via (TSV) of the pixel. Accordingly, the through-silicon via (TSV) may be configured to discharge charges that are photoelectrically converted by the organic photo-detector 20 to a floating diffusion node $FD_1$ through the through-silicon-via (TSV). As described herein, each floating diffusion node $FD_1$ may be referred to as a first floating diffusion node.

In some example embodiments, the through-silicon-via (TSV) may include an insulating layer 28a that may include an oxide/nitride material and a charging conductive material 28b, configured to fill an internal portion of the throughsilicon-via (TSV), that may include metal and doped polysilicon (doped poly si). The through-silicon-via (TSV) may be in the insulating layer 60.

In some example embodiments, the color filter array 30 is between the organic photo-detector 20 and the photo-detector array 40, and it does not transmit the near infrared ray having passed through the organic photo-detector 20. In detail, in some example embodiments, the color filter array 30 includes a first color filter 31 between the organic photo-detector 20 and the first photo-detector 41 and configured to selectively transmit first visible light (also referred to herein as a first limited wavelength spectrum of visible light), for example, red visible light (R: Red), a second color filter 32 between the organic photo-detector 20 and the second photo-detector 43 and configured to selectively transmit second visible light (also referred to herein as a second limited wavelength spectrum of visible light), for example, green visible light (G: Green), and a third color filter 33 between the organic photo-detector 20 and the second photo-detector 43 and configured to selectively transmit third visible light (also referred to herein as a third limited wavelength spectrum of visible light), for example, blue visible light (B: Blue). Accordingly, the color filter array 30 may selectively transmit a limited wavelength spectrum of visible light, for example one or more of the first visible light, the second visible light, or the third visible light. As shown in FIG. 1, in some example embodiments, the first color filter 31 overlaps the first photo-detector in a direction that is perpendicular or substantially perpendicular (e.g., perpendicular within manufacturing tolerances and/or material tolerances) to an upper surface 50a of the signal unit 50, second color filter 32 overlaps the second photo-detector 42 in a direction that is perpendicular or substantially perpendicular (e.g., perpendicular within manufacturing tolerances and/or material tolerances) to the upper surface 50a of the signal unit 50, and the third color filter 33 overlaps the third photo-detector 43 in a direction that is perpendicular or substantially perpendicular (e.g., perpendicular within manufacturing tolerances and/or material tolerances) to an upper surface 50a of the signal unit 50. Accordingly, the first color filter 31 may correspond to the first photo-detector 41, the second color filter 32 may correspond to the second photo-detector 42, and the third color filter 33 may correspond to the third photo-detector 43.

As shown in FIG. 1, the color filter array 30 may be on a lower insulating layer 70 and may be embedded within an upper insulating layer 80. As shown in FIG. 1, the organic photo-detector 20 may be on the upper insulating layer 80. In some example embodiments, the organic photo-detector 20 may be between the color filter array 30 and the photo-detector array 40, and the organic photo-detector 20 may be on the lower insulating layer 70 and between the lower insulating layer 70 and the upper insulating layer 80, where the color filter array 30 may be embedded in the upper insulating layer 80.

In some example embodiments, the organic photo-detector 20 may be between the color filter array 30 and the photo-detector array 40, and the color filter array may be configured to selectively transmit both a limited wavelength spectrum of visible light that the one or more photo-detectors of the photo-detector array 40 may be configured to selectively detect and the near-infrared wavelength spectrum of light (near infrared rays) that may be selectively detected by the organic photo-detector. For example, the color filter array 30 may include a first color filter 31 configured to selectively transmit first visible light and the near infrared rays, a second color filter 32 configured to selectively transmit second visible light and the near infrared rays, and a third color filter 33 configured to selectively transmit third visible light and the near infrared rays.

The photo-detector array 40 that is on the color filter array 30 may include one or more photo-detectors. In detail, the photo-detector array 40 may include a first photo-detector 41 for selectively detecting ("configured to selectively detect") the first visible light, a second photo-detector 42 for selectively detecting the second visible light, and a third photo-detector 43 for selectively detecting the third visible light. The respective photo-detectors 41, 42, and 43 may be a silicon photodiode (Si-PD). As shown in FIG. 1, each separate photo-detector 41, 42, 43 may be included in a separate pixel $P_R$, $P_G$, $P_B$ of the image sensor 100, such that each separate pixel includes an individual photo-detector. While FIG. 1 illustrates an image sensor 100 with a photo-detector array 40 that includes multiple photo-detectors 41, 42, 43, it will be understood that, in some example embodiments, the photo-detector array 40 may include a single, individual photo-detector.

The visible light (R, G, B) having passed through the organic photo-detector 20 and the color filter array 30 may be respectively photoelectrically converted by the photo-detectors 41, 42, and 43, and the photoelectrically converted charges may be gathered in the floating diffusion node ($FD_2$, Full-Well). In some example embodiments, the number of charges gathered in the floating diffusion node $FD_2$ may be proportional to the intensity of the visible light (R, G, B).

Accordingly, the photo-detector array 40 may include one or more photo-detectors 41, 42, 43, and the one or more photo-detectors 41, 42, 43 may be configured to detect some or all of the selectively transmitted limited wavelength spectrum of visible light and photoelectrically convert the limited wavelength spectrum of visible light. Additionally, the image sensor 100 may be configured to transmit the charges that are photoelectrically converted by the one or more photo-detectors 41, 42, 43 to one or more corresponding floating diffusion nodes $FD_2$ of the one or more pixels $P_R$, $P_G$, $P_B$ in which the one or more photo-detectors 41, 42, 43 are included. As described herein, each floating diffusion node $FD_2$ may be referred to as a second floating diffusion node.

In some example embodiments, the color filter array 30 may be absent from the image sensor 100, and one or more photo-detectors of the photo-detector array 40 may be configured to selectively detect (e.g., selectively absorb) a limited wavelength spectrum of visible light, out of a larger wavelength spectrum of visible light that may be incident on the one or more photo-detectors. For example, in an example embodiment of the image sensor 100 wherein the color filter array 30 is absent, and thus the wavelength spectra of light that may be incident on each photo-detector of the photo-detector array 40 from the light-incident surface 100a may include a combination of red, blue, and green visible light, the photo-detector array 40 may include a first photo-detector 41 that is configured to selectively detect red visible light out of all visible light that may be incident on the first photo-detector 41 from the light-incident surface 100a, a second photo-detector 42 that is configured to selectively detect green visible light out of all visible light that may be incident on the second photo-detector 42 from the light-incident surface 100a, and a third photo-detector 43 that is configured to selectively detect blue visible light out of all visible light that may be incident on the third photo-detector 43 from the light-incident surface 100a.

Figure 3A:
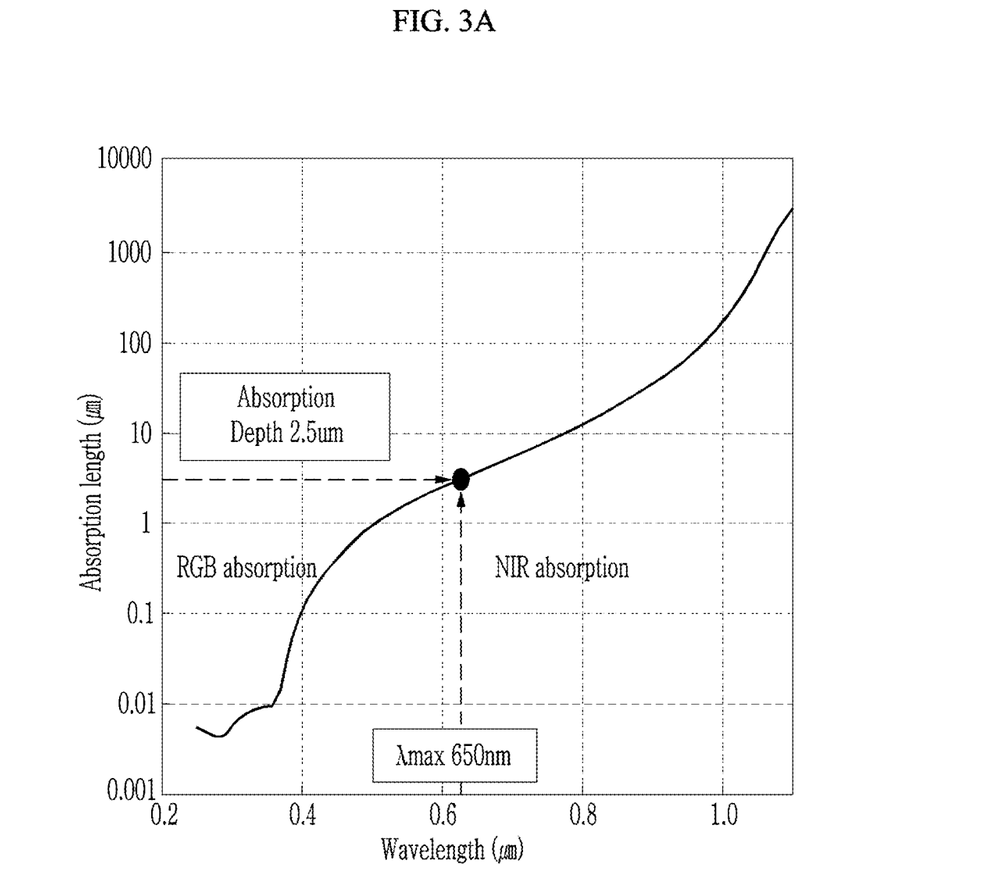
FIG. 3A and FIG. 3B show a graph of a thickness of a photo-detector and a wavelength of absorbed light according to some example embodiments.
Figure 3B:
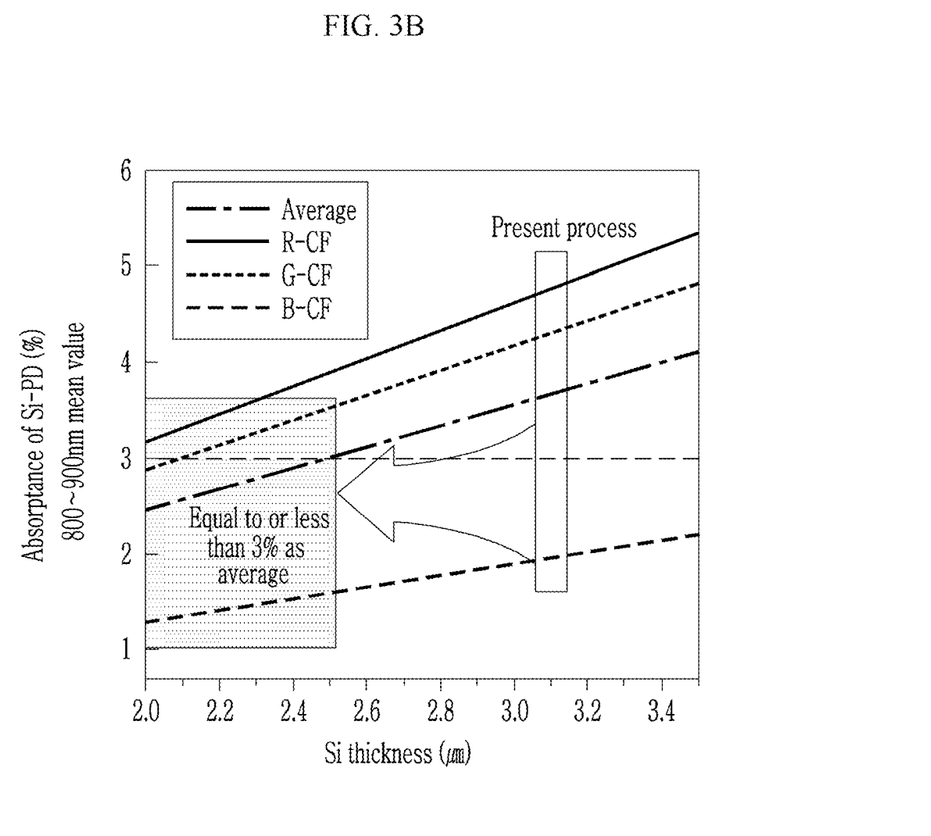

As shown in FIG. 1, the photo-detector array 40 according to some example embodiments may have a back side illumination (BSI) structure, wherein the photo-detector array 40 is between the signal unit 50 and the light-incident surface 100a of the image sensor 100, and referring to FIG. 1 and FIG. 3A, when a thickness (D) (i.e., absorption depth) of the photo-detector array 40 is formed to be at least 2.5 μm, the photo-detectors 41, 42, and 43 do not absorb light (of which the wavelength is equal to or greater than 650 nm) of the near infrared ray (NIR) range except the visible light (RGB). Restated, based on the photo-detector array 40 being at least 2.5 μm, the photo-detector array 40 may be configured to not absorb the near infrared wavelength of light. Therefore, crosstalk may be reduced, and the haze phenomenon in images generated by the image sensor 100, where the haze phenomenon is caused by an absorption of the near infrared ray by a photo-detector of the photo-detector array 40, may be prevented.

While FIG. 1 shows the photo-detector array 40 as having a back side illumination (BSI) structure, it will be understood that in some example embodiments the photo-detector array 40 may have a front side illumination (FSI) structure, wherein the signal unit 50 is between the photo-detector array 40 and the light-incident surface 100a of the image sensor 100.

Hence, the light absorbing area of the visible light may be controlled by controlling the thickness (D) of the photo-detector array 40 according to some example embodiments. In detail, referring to FIG. 1 and FIG. 3B, an absorption rate of the near infrared ray except for the visible light (RGB) may be configured to be equal to or less than 3% as an average compared to the conventional process by forming the thickness (D) of the photo-detector array 40 to be equal to or less than 2.5 μm.

Figure 5A:
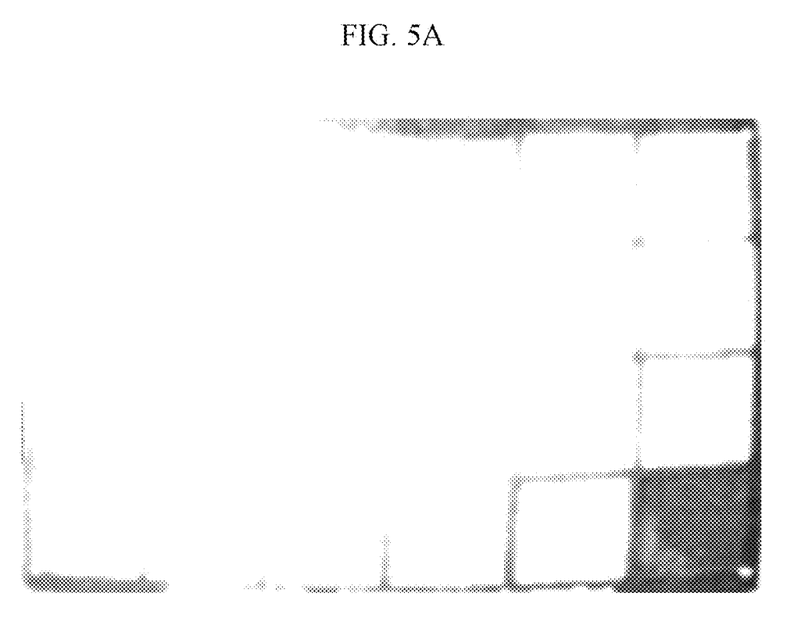
FIG. 5A shows an image that may be generated by an image sensor having a floating diffusion node $FD_1$ and a floating diffusion node $FD_2$, according to some example embodiments.
Figure 5B:
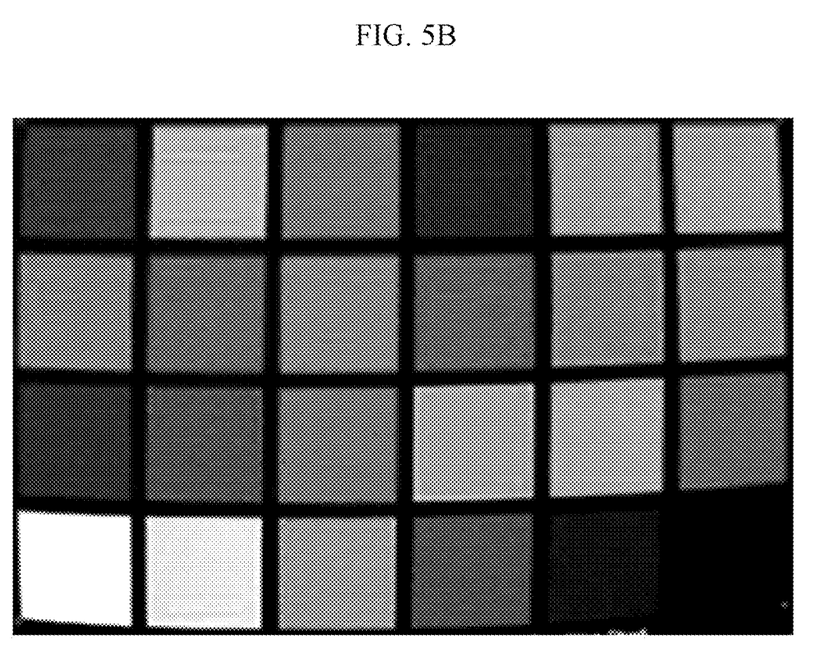
FIG. 5B shows an image that may be generated by an image sensor having a floating diffusion node $FD_1$ and a floating diffusion node $FD_2$, according to some example embodiments.

An area $A_1$ of the floating diffusion node $FD_1$ and an area $A_2$ of the floating diffusion node $FD_2$ will now be described with reference to FIG. 5A and FIG. 5B. FIG. 5A shows an image that may be generated by an image sensor 100 having a floating diffusion node $FD_1$ and a floating diffusion node $FD_2$, according to some example embodiments. FIG. 5B shows an image that may be generated by an image sensor 100 having a floating diffusion node $FD_1$ and a floating diffusion node $FD_2$, according to some example embodiments.

Regarding another light source or sunlight, the number of photons of the near infrared ray (NIR) may be greater than the number of photons of the visible light (RGB). Therefore, when the area $A_1$ of the floating diffusion node $FD_1$ is formed to be equal to or less than the area $A_2$ of the floating diffusion node $FD_2$, a blooming and overflow phenomenon may occur in an image generated based on the charges transmitted to the floating diffusion nodes $FD_1$ and $FD_2$ of the image sensor 100, as shown in FIG. 5A.

However, when the area $A_1$ of the floating diffusion node $FD_1$ is greater than the area $A_2$ of the floating diffusion node $FD_2$, for example, when there is sunlight and the area $A_1$ of the floating diffusion node $FD_1$ is twice greater than the area $A_2$ of the floating diffusion node $FD_2$ or when there are sunlight and an external light source and the area $A_1$ of the floating diffusion node $FD_1$ is five times greater than the area $A_2$ of the floating diffusion node $FD_2$, no blooming and overflow phenomenon may occur in an image generated based on the charges transmitted to the floating diffusion nodes $FD_1$ and $FD_2$ of the image sensor 100, as shown in FIG. 5B. Thus, the performance of the image sensor 100 may be improved based on the area $A_1$ of the floating diffusion node $FD_1$ being greater than the area $A_2$ of the floating diffusion node $FD_2$.

In detail, when the area $A_2$ of the floating diffusion node $FD_2$ is 0.2*0.46=0.092 (nm) or 0.25*0.44, the area $A_2$ of the floating diffusion node $FD_2$ may be 0.79*0.48=0.3792 (nm), but some example embodiments is not limited thereto.

In some example embodiments, the area $A_1$ of the floating diffusion node $FD_1$ may be greater than the area $A_2$ of the floating diffusion node $FD_2$ by equal to or greater than twice to five times and equal to or less than ten times.

In some example embodiments, the signal unit 50 includes a first transistor M1, a second transistor M2, and a third transistor M3. The charges photoelectrically converted by the organic photoelectric conversion layer 22 and gathered in the floating diffusion node $FD_1$ may be discharged through the first transistor M1 and the second transistor M2, and the charges photoelectrically converted by the photo-detector array 40 and gathered in the floating diffusion node $FD_2$ may be discharged through the third transistor M3.

As described above, the organic photo-detector 20 of the image sensor 100 according to some example embodiments may be on the color filter array 30. Therefore, the phenomenon in which elements are degraded at the manufacturing temperature of the color filter array 30 and the UV exposure condition may be prevented, thereby maintaining the characteristic of the NIR organic photo-detector 20.

Figure 6:
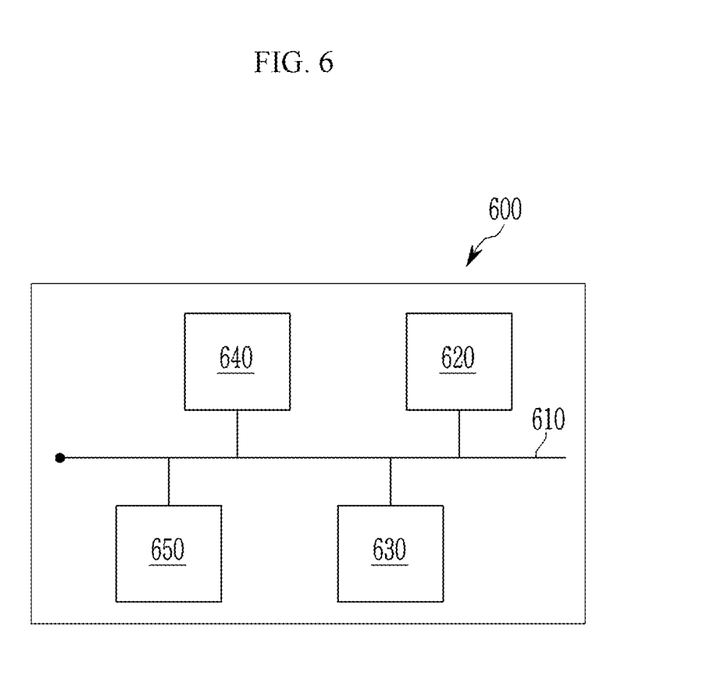
FIG. 6 is a schematic diagram of an electronic device according to some example embodiments.

FIG. 6 is a schematic diagram of an electronic device 602 according to some example embodiments.

As shown in FIG. 6, an electronic device 602 may include a processor 620, a memory 630, image sensor device 640, and display device 650 that are electrically coupled together via a bus 610. The image sensor device 640 may be any of the image sensors 100 of any of the example embodiments as described herein. The memory 630, which may be a non-transitory computer readable medium, may store a program of instructions. The processor 620 may execute the stored program of instructions to perform one or more functions, including generating an image based on the charges collected at the floating diffusion nodes $FD_1$ and $FD_2$ of the image sensor 100. The processor 620 may further may execute the stored program of instructions to display the generated image on display device 650. The processor 620 may be configured to generate an output (e.g., an image to be displayed on the display device 650).

While the inventive concepts have been described in connection with what is presently considered to be practical example embodiments, it is to be understood that the inventive concepts are not limited to the disclosed example embodiments, but, on the contrary, is intended to cover various modifications and equivalent arrangements included within the spirit and scope of the appended claims. Therefore, the above detailed description is not to be interpreted as being restrictive, but is to be considered as being illustrative. The scope of the present inventive concepts is to be determined by reasonable interpretation of the claims, and all alterations within equivalences of the present inventive concepts fall within the scope of the present inventive concepts.

What is claimed is:

1. An image sensor, comprising:
   a color filter array configured to selectively transmit a limited wavelength spectrum of visible light;
   an organic photo-detector above the color filter array, the organic photo-detector configured to selectively detect a near infrared wavelength spectrum of light and photoelectrically convert the detected near infrared wavelength spectrum of light;
   a photo-detector array beneath the color filter array, the photo-detector array including a photo-detector configured to detect the selectively transmitted limited wavelength spectrum of visible light and photoelectrically convert the limited wavelength spectrum of visible light; and
a through-silicon-via extending through the organic photo-detector, the through-silicon-via configured to discharge charges that are photoelectrically converted by the organic photo-detector to a first floating diffusion node through the through-silicon-via,
wherein the image sensor is configured to transmit charges photoelectrically converted by the photo-detector to a second floating diffusion node,
wherein an area of the first floating diffusion node is greater than an area of the second floating diffusion node.

2. The image sensor of claim 1, wherein
the photo-detector array has a back side illumination (BSI) structure, and
a thickness of the photo-detector array is at least 2.5 μm, such that the photo-detector array is configured to not absorb the near infrared wavelength spectrum of light.

3. The image sensor of claim 2, wherein
the near infrared wavelength spectrum of light has a wavelength that is equal to or greater than 800 nm.

4. The image sensor of claim 3, wherein
the through-silicon-via includes metal and doped polysilicon (doped poly si).

5. The image sensor of claim 4, wherein
the color filter array includes a first color filter, a second color filter, and a third color filter,
the photo-detector array includes a first photo-detector, a second photo-detector, and a third photo-detector, and
the first color filter corresponds to the first photo-detector, the second color filter corresponds to the second photo-detector, and the third color filter corresponds to the third photo-detector.

6. The image sensor of claim 5, wherein
the first color filter is configured to selectively transmit red visible light,
the second color filter is configured to selectively transmit green visible light, and
the third color filter is configured to selectively transmit blue visible light.

7. The image sensor of claim 6, further comprising:
a plurality of condensing lenses on the organic photo-detector, each condensing lens of the plurality of condensing lenses corresponding to a separate, respective color filter of the first color filter, the second color filter, and the third color filter.

8. The image sensor of claim 7, wherein
the area of the first floating diffusion node is greater than the area of the second floating diffusion node by twice to five times.

9. The image sensor of claim 7, wherein
the area of the first floating diffusion node is greater than the area of the second floating diffusion node by five times to ten times.

10. An electronic device including the image sensor of claim 1.

11. An image sensor, comprising:
an organic photo-detector, the organic photo-detector configured to selectively detect a near infrared wavelength spectrum of light and photoelectrically convert the detected near infrared wavelength spectrum of light; and
a photo-detector array on the organic photo-detector, the photo-detector array including a photo-detector configured to detect a limited wavelength spectrum of visible light and photoelectrically convert the limited wavelength spectrum of visible light,
wherein the image sensor is configured to discharge charges photoelectrically converted by the photo-detector to a first floating diffusion node,
wherein the image sensor is further configured to discharge charges photoelectrically converted by the organic photo-detector to a second floating diffusion node,
wherein an area of the first floating diffusion node is greater than an area of the second floating diffusion node.

12. The image sensor of claim 11, wherein
the photo-detector array has a back side illumination (BSI) structure, and
a thickness of the photo-detector array is at least 2.5 μm, such that the photo-detector array is configured to not absorb the near infrared wavelength spectrum of light.

13. The image sensor of claim 12, wherein
the near infrared wavelength spectrum of light has a wavelength that is equal to or greater than 800 nm.

14. The image sensor of claim 11, further comprising:
a color filter array configured to selectively transmit the limited wavelength spectrum of visible light, such that the photo-detector is configured to detect the selectively transmitted limited wavelength spectrum of visible light.

15. The image sensor of claim 14, wherein
the color filter array is between the organic photo-detector and the photo-detector array.

16. The image sensor of claim 14, wherein
the organic photo-detector is between the color filter array and the photo-detector array.

17. The image sensor of claim 14, wherein
the color filter array includes a first color filter, a second color filter, and a third color filter,
the photo-detector array includes a first photo-detector, a second photo-detector, and a third photo-detector, and
the first color filter corresponds to the first photo-detector, the second color filter corresponds to the second photo-detector, and the third color filter corresponds to the third photo-detector.

18. The image sensor of claim 17, wherein
the first color filter is configured to selectively transmit red visible light,
the second color filter is configured to selectively transmit green visible light, and
the third color filter is configured to selectively transmit blue visible light.

19. The image sensor of claim 17, further comprising:
a plurality of condensing lenses on the organic photo-detector, each condensing lens of the plurality of condensing lenses corresponding to a separate, respective color filter of the first color filter, the second color filter, and the third color filter.

20. The image sensor of claim 11, wherein
the area of the first floating diffusion node is greater than the area of the second floating diffusion node by twice to five times.

21. The image sensor of claim 11, wherein
the area of the first floating diffusion node is greater than the area of the second floating diffusion node by five times to ten times.

22. An electronic device including the image sensor of claim 11.

* * * * *